(12) United States Patent
Lang et al.

(10) Patent No.: US 7,634,193 B2
(45) Date of Patent: Dec. 15, 2009

(54) PRINTED CIRCUIT BOARD ASSEMBLY

(75) Inventors: Werner Lang, Ergersheim (DE);
Michael Witzke, Ansbach (DE); Harald Emmert, Bad Windsheim (DE)

(73) Assignee: Lang Mekra North America, LLC, Ridgeway, SC (US)

( * ) Notice: Subject to any disclaimer, the term of this patent is extended or adjusted under 35 U.S.C. 154(b) by 468 days.

(21) Appl. No.: 11/527,874

(22) Filed: Sep. 27, 2006

(65) Prior Publication Data
US 2008/0247751 A1    Oct. 9, 2008

(30) Foreign Application Priority Data
Sep. 27, 2005   (DE) ................ 10 2005 046 175

(51) Int. Cl.
*G03B 17/00* (2006.01)
*H01R 29/00* (2006.01)
(52) U.S. Cl. ..................... 396/542; 439/43
(58) Field of Classification Search ............. 396/542; 439/43, 44, 49, 50, 65, 74
See application file for complete search history.

(56) References Cited
U.S. PATENT DOCUMENTS

| | | | | |
|---|---|---|---|---|
| 2,951,184 | A | | 8/1960 | Wyma |
| 4,823,233 | A | * | 4/1989 | Brown et al. ............. 361/692 |
| 5,390,083 | A | | 2/1995 | Decker et al. |
| 5,860,033 | A | * | 1/1999 | Stanchus et al. ........... 396/176 |
| 5,920,061 | A | * | 7/1999 | Feng ..................... 235/472.01 |
| 2001/0017987 | A1 | | 8/2001 | Tanaka |
| 2002/0006503 | A1 | | 1/2002 | Watanabe et al. |
| 2002/0071259 | A1 | * | 6/2002 | Roos ...................... 361/784 |
| 2003/0236006 | A1 | * | 12/2003 | Yamashita ................. 439/65 |

FOREIGN PATENT DOCUMENTS

| | | |
|---|---|---|
| DE | 1 724 873 | 6/1956 |
| DE | 1 108 756 | 6/1961 |
| DE | 1 962 067 | 6/1967 |
| DE | 38 36 701 A1 | 5/1990 |
| DE | 94 13 254 U1 | 2/1996 |
| EP | 0 591 585 A1 | 4/1994 |
| JP | 11265748 A | 9/1999 |

* cited by examiner

*Primary Examiner*—Rodney E Fuller
(74) *Attorney, Agent, or Firm*—McNair Law Firm, P.A.; Seann P. Lahey

(57) ABSTRACT

A printed circuit board comprises at least one printed circuit board with at least one electrical contact and one circuit board connector. The circuit board connector includes a printed circuit board provided with one or several open tracks on at least one side for connection with electrical contact(s) of the printed circuit board.

17 Claims, 1 Drawing Sheet

PRINTED CIRCUIT BOARD ASSEMBLY

BACKGROUND OF THE INVENTION

The present invention relates to a printed circuit board assembly for a camera module and the like, and more particularly to such an assembly.

Printed circuit boards typically comprise electronic circuits formed on a substrate carrier preferably in the form of electronic components connected by printed strip conductors. The individual printed circuit board can be connected by at least one contact to an electrical connection line for the transmission of signals. Depending on the complexity of the desired circuit, several of the printed strips are connected together with the connection lines connecting different printed circuit boards. If the connection lines are in form of electric wires, this interconnection requires expensive wiring with corresponding space requirement, wiring expense and resulting lack of oversight of the complex circuit assembly.

For this reason a method is known in the computer field by which individual printed circuit boards in form of "plug-in" cards are plugged parallel to each other into a common circuit board connector. The required electrical connections to the different printed circuit boards is achieved in a simple manner via the plug-in connections.

The known assemblies of printed circuit boards which are plugged into the circuit board connector by one of their edges are however inflexible due to the prescribed plug-in locations and cannot be adapted variably to different numbers, dimensions and connections of printed circuit boards. In addition the individual printed circuit boards are attached on only one side. It is impossible to install circuits, e.g., end interference components, on the circuit board connector, and an additional printed circuit board bearing these circuits is necessary.

It is the object of the present invention to avoid the shortcomings mentioned above in printed circuit board assemblies, and to provide an advantageous assembly for a camera such as used for vehicles, surveillance, and the like.

SUMMARY OF THE INVENTION

The above objective is accomplished in accordance with the present invention by providing a printed circuit board assembly comprising at least one printed circuit board having at least one electrical contact and one circuit board connector. The circuit board connector includes a printed circuit board having tracks formed on at least one side for the connection with at least one electrical contact of the printed circuit board.

Preferably a plurality of printed circuit boards can be connected to the circuit board connector which includes several tracks. For that reason a plurality of printed circuit boards shall be discussed below, but it is possible, of course, to utilize a printed circuit board assembly with a single printed circuit board.

By designing the circuit board connector in form of a printed circuit board any printed circuit boards can be interconnected as long as the circuit board connector has suitable tracks. The circuit board connector can be produced in the same manner as the printed circuit boards themselves and therefore simply and economically. No soldering or similar connection of the individual printed circuit board contact with electrical lines, cables, etc. is required. This markedly reduces the wiring costs and allows for tighter assembly of the different printed circuit boards with good oversight and assembly-friendly.

Printed circuit boards and the circuit board connector may be formed as known printed circuit boards with a carrier and tracks laid out on same which can be imprinted, attached by soldering or bonding, freely etched, etc. The bare tracks of the circuit board connector are electrically conductive, preferably metallic.

In a preferred embodiment the electrical contacts of the printed circuit board are fixedly connected with the board, in particular by soldering or screwing, and thus protrude from the printed circuit board in such a manner that they contact one of the tracks of the circuit board connector when the latter is connected to the printed circuit board.

The circuit board connector and the printed circuit board are preferably placed at a right angle to each other in the connected state. This allows for easy and variable assembly as the individual printed circuit boards can be placed and connected to the circuit board connector in the direction of the latter. Thus different numbers of printed circuit boards with freely selectable distances from each other can be installed parallel to each other. The distance from a housing surrounding the printed circuit board assembly can thus be selected as desired, thereby compensating for tolerances.

The circuit board connector and the printed circuit boards can be connected to each other in a detachable or permanent manner. A permanent connection can be achieved, for example, through bonding or soldering. A detachable connection can be realized, for example, by means of interlocking and/or frictionally engaged contact between the circuit board connector and the printed circuit boards. In a preferred embodiment the circuit board connector and/or the printed circuit board is provided with complementing recesses. Each individual printed circuit boards can be provided with one or more slots which are about of the thickness of the circuit board connector wall and into which part of the circuit board connector can be inserted in a frictionally engaged manner. For this purpose the circuit board connector can be generally U-shaped, whereby the printed circuit boards are provided with two slots for the engagement of the two longitudinal legs of the circuit board connector.

For easy assembly and also for the stabilization of the printed circuit board assembly, a spacer, in particular a plastic spacer, can be provided between the printed circuit boards. Similarly, a spacer can be used between several printed circuit boards and hold them apart, or it can be installed separately between each pair of printed circuit boards. In a preferred embodiment the cross-section of such a spacer has a contour corresponding to the printed circuit board next to which it is installed. Thus, it does not extend beyond the printed circuit board assembly and does not increase its outside dimensions.

The spacer may additionally be provided with edge notches so that it can be connected and interlocked with the circuit board connector and/or the printed circuit boards. It may, for instance, be provided with the same kind of slots as the printed circuit boards themselves. These slots may advantageously be somewhat narrower than the wall thickness of the circuit board connector to fix the spacer on the circuit board connector with elastic deformation of the spacer. The printed circuit boards themselves can be movable in the direction of the circuit board connector since they are held in that direction by the spacers.

In order to stabilize the assembly the printed circuit boards, a recess can be provided into which a guiding element is engaged when connected. This interlocking and/or frictional engagement provides the assembly, together with the circuit board connector, with additional stability.

Electronic components, in particular auxiliary components, safety devices, etc., can be installed advantageously on the circuit board connector. Thereby the circuit board connector itself can contain part of the circuit to be realized, thus saving space on the actual printed circuit boards. Since the circuit board connector in form of a printed circuit board is already produced as such, no additional production means are required to equip it with such components.

A printed circuit board assembly may advantageously be used with a camera, in particular an electronic camera, wherein the printed circuit board assembly is incorporated in a camera housing. Control devices for camera circuits with several printed circuit boards must be installed in a restricted space and connected to each other. In such an embodiment of the present invention a first printed circuit board may, for example, contain the sensor of the camera, while optional, additional printed circuit boards contain power supply component groups, heating elements or similar devices. The camera lens can be designed advantageously as a guiding element and located directly on the printed circuit board which contains the camera sensor for the taking of pictures.

For protection against humidity, the printed circuit board assembly can be sealed by casting in the camera housing. Advantageously, not only is the entire printed circuit board assembly sealed, but the circuit board connector so that the connector is firmly connected to the housing, whereby the connection lines to the circuit board connector are tightly sealed against fluids or gas. This prevents the entry of moisture along the connection lines into the housing interior as a result of capillary effect. At the same time the plug-in of the printed circuit boards and of the electric contact on the circuit board connector is not affected.

Further functions, advantages and characteristics of the present invention are derived from the sub-claims and the following examples of embodiments.

DESCRIPTION OF THE DRAWINGS

The construction designed to carry out the invention will hereinafter be described, together with other features thereof.

The invention will be more readily understood from a reading of the following specification and by reference to the accompanying drawings forming a part thereof, wherein an example of the invention is shown and wherein.

DESCRIPTION OF A PREFERRED EMBODIMENT

Referring now in more detail to the drawings, the invention will now be described in more detail.

Figure 1:
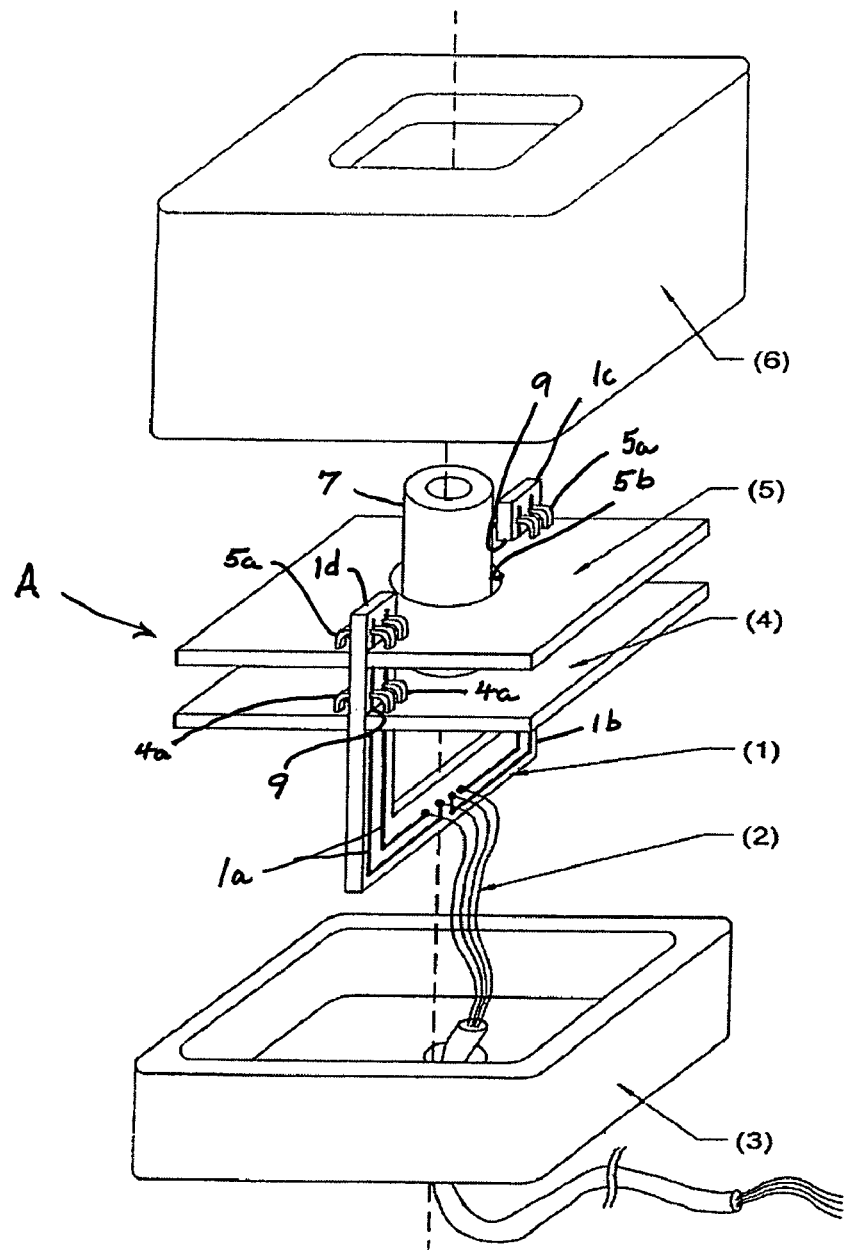
FIG. 1 is a perspective view with parts removed illustrating the controls for a camera with a printed circuit board arrangement constructed according to the present invention.
Figure 2:
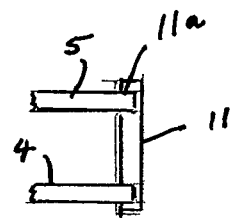
FIG. 2 is a side elevation illustrating a circuit board spacer according to the invention.

As shown in FIG. 1, a camera with controls including a printed circuit board assembly, designated generally as A, is illustrated according to the present invention. The camera is designed to be integral with the controls and includes a camera lens 7, and controls formed on printed circuit board assembly A located in a housing 3, 6.

In the illustrated embodiment, the printed circuit board assembly comprises a plurality of printed circuit boards 4, 5 provided in a known manner with electronic components for controls and the like, and printed electrically conductive connector lines (not shown). In particular a sensor (not shown) of the camera is included on the printed circuit board 4 over which camera lens 7 is positioned in such manner that light is focused on the sensor.

In addition, the assembly comprises a U-shaped circuit board connector 1 including a printed circuit board. On the side shown in FIG. 1 circuit board connector 1 has two open electrically conductive tracks 1a connected electrically to electrical connection circuit lines 2. The opposite side also includes tracks 1a. Connection circuit lines 2 emerge from a lower housing half 3 which, together with an upper housing 6, contains the printed circuit board assembly when assembled. The illustrated board connector includes a base 1b and a pair of upstanding legs 1c and 1d.

Circuit board connector 1 is fitted by its lower portion, essentially the horizontal part of the U, into the lower housing 3 in such manner that it protrudes from the housing. As a result the connection circuit lines 2 are sealed against gases in their connection with the housing interior and no moisture can penetrate here. On the other hand the electrical contact of the circuit board connector 1 with the printed circuit boards 4, 5 is not affected.

Printed circuit board 5 has a guide opening 5b in its center in which the camera lens 7 penetrates interlockingly. The camera lens thus functions as a guide element of the printed circuit board 5. Furthermore the camera lens 7 is located above the sensor (not shown) on circuit board 4 and is permanently connected to the circuit board so that incidental light is focused through the lens 7 onto the sensor formed on the printed circuit board 4.

Each printed circuit board has two edge slots 9 extending inward from the edges into the interior of the printed circuit board. The slots are somewhat narrower than the wall thickness of the circuit board connector so that the printed circuit boards 4, 5 are installed in a frictionally engaged manner on the two legs of the U-shaped circuit board connector and are fixed at a desired level.

At slots 9 the contacts 4a, 5a are designed to electrically connect to the tracks 1a on the printed circuit board, and protrude from printed circuit boards 4, 5 so that they are received in and/or pressed against tracks 1a of the circuit board connector. Thus the printed circuit boards 4, 5 are electrically connected to the connection lines 2 by the contacts 4a or 5a and the tracks 1a of the circuit board connector 1.

A spacer 11 is located between the two printed circuit boards 4, 5 and is illustrated in the form of a frame on the outer edge of the printed circuit boards 4, 5. In the embodiment spacer 11 is made of plastic and is provided with slots 11a like the printed circuit boards in the embodiment described above. The slots in the spacer are somewhat narrower than the wall thickness of the circuit board connector 1, and are pressed in a frictionally engaged manner against the latter. The slots in the printed circuit board can then be made wider because the spacer delimits the movement of the printed circuit board 3 in the direction of the long legs of the circuit board connector.

The engagement of electrical contacts 4a, 5a of the printed circuit boards with the tracks 1a on the circuit board connector 1 can be ensured, for example, by elastically pre-stressed contacts 4a, 5a.

Electrical contacts 4a, 5a may be "L" shaped and soldered to the printed circuit boards 4, 5 and to the tracks 1a in a fixed embodiment. Alternately, in a detachable embodiment, the contacts may be soldered to one of the circuit boards and the board connector, and resiliently pressed against the other. Also, the contacts may be of an "inverted" U-shape, i.e., one piece, and the tracks may be conductive and formed through the vertical legs and open at the top to receive the one-piece contacts.

The placement of camera lens 7 within the printed circuit board 5 and on printed circuit board 4, the placement of printed circuit boards 4, 5 on the connector 1 provides a very compact camera protected by the housing 3, 6. For this the housing halves 3 and 6 can be connected to each other so as to be sealed against fluids or gas.

While a preferred embodiment of the invention has been described using specific terms, such description is for illustrative purposes only, and it is to be understood that changes and variations may be made without departing from the spirit or scope of the following claims.

What is claimed is:

1. A printed circuit board assembly comprising:
    a plurality of printed circuit boards each having electrical contacts;
    a circuit board connector including a printed circuit board and an open conductive track provided on at least one side of the circuit board connector;
    said plurality of printed circuit boards connected to said circuit board connector so that said open conductive track is connected with said electrical contacts on said printed circuit boards; and,
    a spacer carried on a peripheral edge of said printed circuit boards interconnecting said printed circuit boards to limit movement of said printed circuit boards along said circuit board connector.

2. The assembly of claim 1 wherein the conductive track is metallic.

3. The assembly of claim 1 where the electrical contacts of the printed circuit boards protrude to contact the conductive track of the circuit board connector when connected.

4. The assembly of claim 3 wherein the electrical contacts are resilient and designed in such manner to be biased against the track on the circuit board connector.

5. The assembly of claim 4 wherein the circuit board connector and the printed circuit boards are connected in a detachable manner by means of the resilient contacts.

6. The assembly of claim 1 wherein the circuit board connector and the printed circuit boards are permanently connected to each other.

7. The assembly of claim 1 wherein one of the circuit board connector and the printed circuit boards are provided with slots so that the board connector and the printed circuit boards can be interlocked when connected.

8. The assembly of claim 1 wherein the spacer includes guide notches interlocked in connection with the circuit board connector.

9. The assembly of claim 1 wherein said plurality of printed circuit boards includes a first printed circuit board and a second printed circuit board, a guide opening formed in the first printed circuit board, and a guide element connected to said second printed circuit board being received through the guide opening when the printed circuit boards are connected by the circuit board connector.

10. The assembly of claim 9 wherein the printed circuit board assembly is installed in a camera housing and the guide element includes a camera lens.

11. The assembly of claim 1 wherein the circuit board connector has a generally U-shaped cross-section formed by a base and a pair of special upstanding board legs.

12. The assembly of claim 11 wherein the printed circuit boards are disposed at a right angle relative to the circuit board connector legs when connected.

13. The assembly of claim 1 wherein the printed circuit board assembly is installed in a camera housing.

14. The assembly of claim 13 including a camera lens designed as the guide element extending centrally through the guide opening.

15. A printed circuit board assembly comprising:
    a first printed circuit board having an electrical contact;
    a second printed circuit board having an electrical contact
    a circuit board connector having an open conductive track provided on at least one side of the board connector;
    the circuit board connector including a pair of spaced opposing legs between which both of the first and second printed circuit boards are carried, wherein a first leg of said circuit board connector is received within a first edge slot disposed along a first outer edge on a first side of said printed circuit boards, and a second leg of said circuit board connector is received within a second edge slot disposed along a second outer edge on a second side of said printed circuit boards opposite said first edge slot so that both said first and second edge slots extend inward toward each other from opposing peripheral edges of said printed circuit boards, and the conductive track being carried on the opposing legs;
    the electrical contacts of the first and second printed circuit board protruding up from the respective printed circuit boards to engage the conductive tracks on the legs of the circuit board connector.

16. The assembly of claim 15 wherein one of the circuit board connector and the printed circuit boards are provided with edge slots so that the board connector and the printed circuit board are interlocked when connected.

17. The assembly of claim 15 including spacers between the first and second printed circuit boards which include edge notches interlocked in connection with the circuit board connector.

* * * * *